(12) United States Patent
Kim

(10) Patent No.: US 7,489,172 B2
(45) Date of Patent: Feb. 10, 2009

(54) DLL DRIVER CONTROL CIRCUIT

(75) Inventor: Kyung-Hoon Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 13 days.

(21) Appl. No.: 11/478,082

(22) Filed: Jun. 30, 2006

(65) Prior Publication Data

US 2007/0069777 A1 Mar. 29, 2007

(30) Foreign Application Priority Data

Sep. 29, 2005 (KR) .................. 10-2005-0091650
Dec. 19, 2005 (KR) .................. 10-2005-0125353

(51) Int. Cl.
 H03L 7/00 (2006.01)
 H03L 7/06 (2006.01)
(52) U.S. Cl. .................. 327/160; 327/151; 327/147; 327/156
(58) Field of Classification Search .................. 327/151, 327/160
 See application file for complete search history.

(56) References Cited

U.S. PATENT DOCUMENTS

| 6,011,732 | A | 1/2000 | Harrison et al. | |
|---|---|---|---|---|
| 6,525,988 | B2 | 2/2003 | Ryu et al. | |
| 6,768,690 | B2 * | 7/2004 | Kwon et al. | 365/194 |
| 6,825,703 | B1 | 11/2004 | Kwak | |
| 6,850,107 | B2 | 2/2005 | Gomm | |
| 6,870,415 | B2 * | 3/2005 | Zhang et al. | 327/274 |
| 2003/0002357 | A1 * | 1/2003 | Kwon et al. | 365/194 |
| 2003/0223279 | A1 * | 12/2003 | Lee | 365/196 |
| 2004/0000939 | A1 * | 1/2004 | Meguro | 327/160 |
| 2005/0093599 | A1 | 5/2005 | Kwak | |

FOREIGN PATENT DOCUMENTS

JP 2005-20686 A 1/2005
KR 2001-0064123 7/2001

OTHER PUBLICATIONS

Taiwanese Office Action, with English translation, issued in Taiwanese Patent Application No. TW 095123974, mailed Aug. 14, 2008.

* cited by examiner

*Primary Examiner*—Long Nguyen
*Assistant Examiner*—Ryan C Jager
(74) *Attorney, Agent, or Firm*—McDermott Will & Emery LLP

(57) ABSTRACT

A Delay Locked Loop (DLL) driver control circuit is capable of reducing an amount of current consumption by preventing the output of unnecessary clocks. The DLL driver control circuit includes a DLL driver for driving a DLL clock and a DLL driver controller for generating a control signal to control an operation of the DLL driver in response to a signal having information associated with an active mode. The DLL driver controller is provided with a counter for counting the DLL clock to produce a count a setting value having a plurality of bits and generating an activated equal signal if the two values are the same, and an SR latch for accepting the equal signal and the signal having the information associated with the active mode to provide the control signal.

23 Claims, 5 Drawing Sheets

DLL DRIVER CONTROL CIRCUIT

FIELD OF THE INVENTION

The present invention relates to a semiconductor memory device; and, more particularly, to a Delay Locked Loop (DLL) driver control circuit capable of reducing an amount of current consumption by preventing the output of an unnecessary clock.

DESCRIPTION OF RELATED ARTS

A semiconductor memory device that operates at a high speed such as Double Data Rate Synchronous Dynamic Random Access Memory (DDR SDRAM) transmits data in synchronism with an external clock. For the high speed operation, it is necessary to establish clock synchronization. A DLL circuit is built in a semiconductor to control timing of data to be sent externally from DRAM depending on an external clock in order to synchronize the data with the clock. In other words, the DLL circuit serves to receive an external clock and output data based thereon.

FIG. 1 is a block diagram of a conventional DLL circuit and FIG. 2 is a circuit diagram of the common DLL driver controller 100 shown in FIG. 1.

Referring to FIG. 1, the conventional DLL circuit includes a DLL clock generator 300 that is composed of a clock buffer, a delay line, a phase comparator, a delay controller and a delay replica model. The DLL clock generator 300 generates DLL clocks irclk and ifclk synchronized with a phase of an external clock by performing phase updating. The DLL circuit also includes a DLL driver 200 for driving the internal clock signals irclk and ifclk, and a DLL driver controller 100 for controlling on/off operations of the DLL driver 200. As illustrated in FIG. 2, the DLL driver controller 100 is composed of a NOR gate NR that accepts a signal PDM indicating whether to enter into a power-down mode and a signal SREF containing information on a self refresh. And the NOR gate NR provides a signal DEN to determine whether to operate the DLL driver 200.

The conventional DLL circuit as structured above allows the DLL driver 200 to be turned off during a power-down mode of a memory for low power consumption.

The DLL driver 200, which is under the control of the existing DLL driver controller 100, provides an output unconditionally once an external clock is input, except for the power-down mode or self refresh mode. The DLL driver 200 is always enabled during an active mode interval and thus the DLL clocks are toggled even during a partial interval of the active mode, in which clocks are not needed.

In the conventional DLL circuit as structured above, outputs are coupled with many buffers and transistor gates of the output data path, which has large capacitance value. The more frequently output clocks are toggled, the higher amount of current consumption in the DRAM becomes. This current consumption can amount to dozens of mA.

Consequently, the conventional DLL circuit generates clocks even when they are not used, thereby consuming energy unnecessarily.

SUMMARY OF THE INVENTION

It is, therefore, an object of the present invention to provide a DLL circuit capable of decreasing operating current of a DRAM by preventing DLL clocks from being toggled meaninglessly during any interval, limiting toggling to an interval during which they are actually used, in a normal mode as well as a power-down mode or a self refresh mode.

In accordance with an aspect of the present invention, there is provided a DLL driver control circuit including: a DLL driver for driving a DLL clock; and a DLL driver controller for generating a control signal to control an operation of the DLL driver in response to a signal having information associated with an active mode.

The DLL driver controller includes: a counter for counting the DLL clock to produce a counted value having a plurality of bits; a comparator for comparing the counted value with a setting value having a plurality of bits and generating an activated equal signal if the two values are the same; and an SR latch for accepting the equal signal and the signal having the information associated with the active mode to provide the control signal.

As described above, the present invention allows a DLL clock to be toggled only during a partial interval of an active mode when a signal associated with the active mode (read or write) is input in a state that the DLL driver is turned off.

Other objectives and advantages of the invention will be understood by the following description and will also be appreciated by the embodiments of the invention more clearly.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be set forth in detail with reference to the accompanying drawings so that the invention can be readily carried out by those in the art to which the invention pertains.

Figure 1:
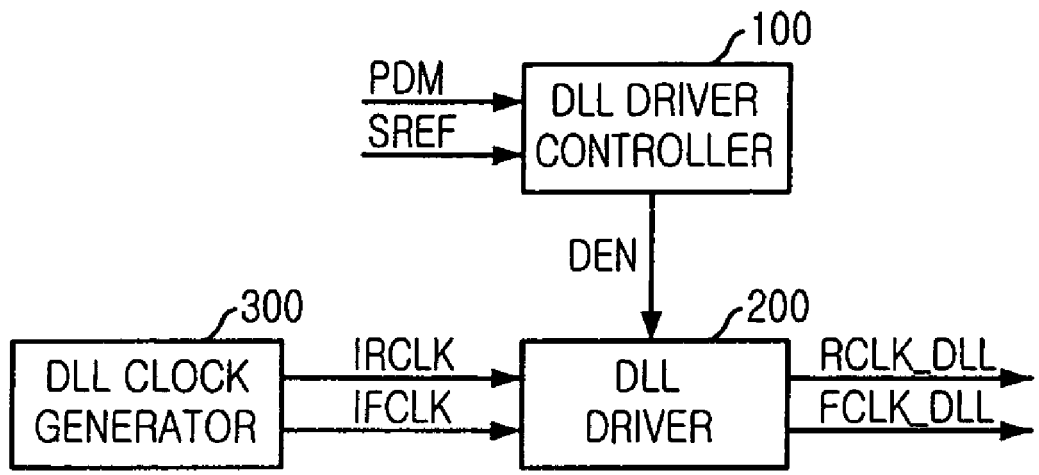
FIG. 1 is a block diagram of a conventional DLL circuit.
Figure 2:
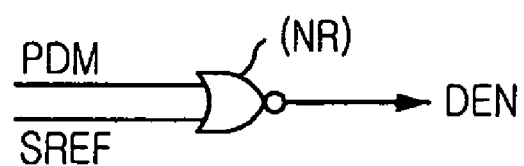
FIG. 2 is a circuit diagram of the DLL driver controller shown in FIG. 1.
Figure 3:
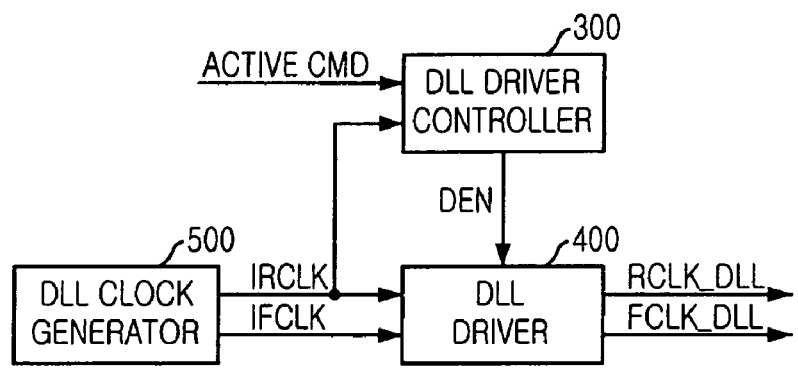
FIG. 3 is a block diagram of a DLL circuit in accordance with an embodiment of the present invention.

FIG. 3 is a block diagram of a DLL circuit in accordance with a preferred embodiment of the present invention.

As exemplified in FIG. 3, the inventive DLL circuit includes a DLL clock generator 500 having a clock buffer, a delay line, a phase comparator, a delay controller and a delay replica model and for generating DLL clocks irclk and ifclk synchronized with a phase of an external clock by performing phase update, a DLL driver 400 for driving the DLL clock signals irclk and ifclk, and a DLL driver controller 300 for controlling an operation of the DLL driver 400 in response to a signal having information associated with an active mode.

Figure 4:
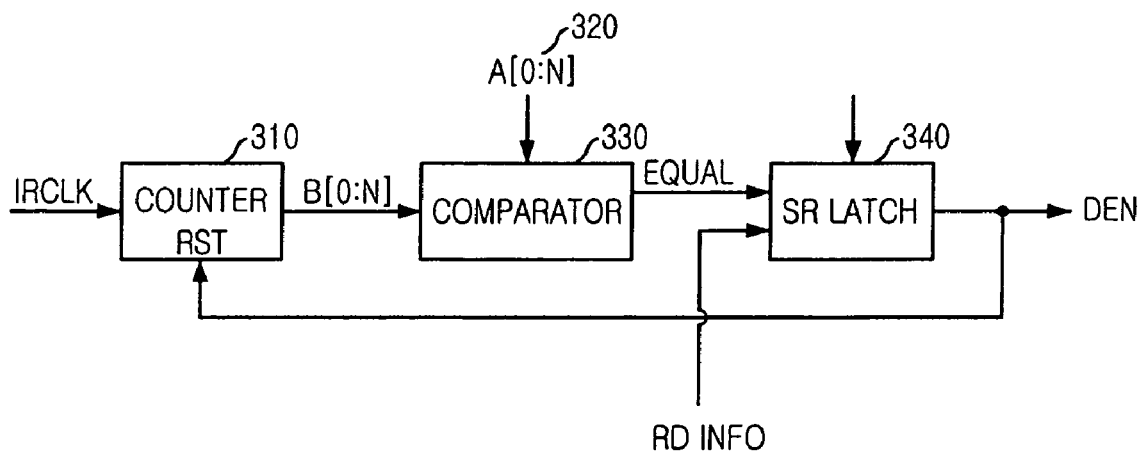
FIG. 4 is a detailed block diagram of the DLL driver controller shown in FIG. 3.

FIG. 4 exemplifies a detailed block diagram of the DLL driver controller 300 of the present invention shown in FIG. 3.

As shown in FIG. 4, the DLL driver controller 300 includes a counter 310 for counting the DLL clock irclk to produce a counted value having a plurality of bits, a comparator 330 for comparing the counted value with a setting value 320 having a plurality of bits to generate an activated equal signal equal if the two values are the same, and an SR latch 340 for accepting the equal signal equal and the signal RD info having the information associated with the active mode to provide a control signal DEN. As the setting value 320, for example, there may be used latency related information that is a setting value of Mode Register Setting (MRS). The information may be Burst Length (BL) or Cas Latency (CL).

Operation of the DLL circuit of the present invention shown in FIGS. 3 and 4 will be described in detail hereinafter. The counter 310 counts the external DLL clock irclk and creates a counted value, having plural bits, and provides it to the comparator 330. At the comparator 330, the plural bits of the counted value are compared with the bits of the setting value 320 to activate the equal signal when they match each other. The SR latch 340 receives the activated equal signal equal and the signal RD info having the information associated with the active mode and activates the control signal DEN. The counter 310 is reset to restart counting the DLL clock irclk when the activated control signal DEN is input thereto as a reset signal RST.

Figure 5:
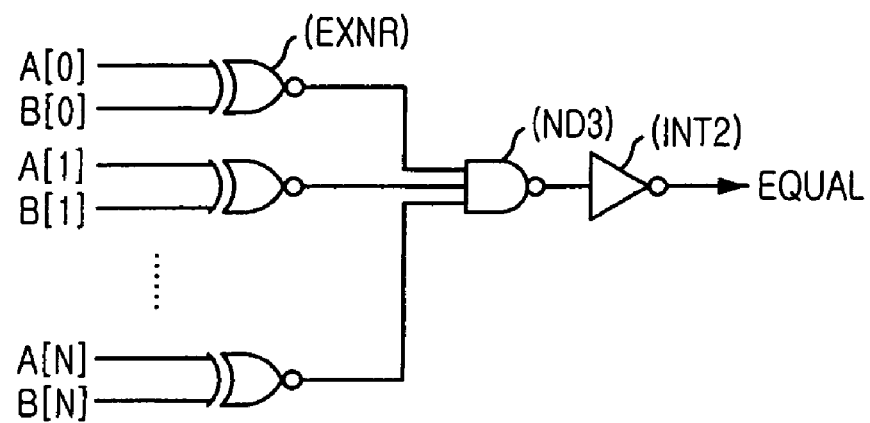
FIG. 5 is a detailed circuit diagram of the comparator exemplified in FIG. 4.

FIG. 5 is a detailed circuit diagram of the comparator 330 shown in FIG. 4.

As illustrated therein, the comparator 330 is provided with a multiplicity of EX-NOR gates EXNRs for receiving corresponding bits of the counted value and the setting value 320, respectively, a NAND gate ND3 for receiving an output of each of the multiplicity of EX-NOR gates EXNRs, and an inverter INT2 for generating the equal signal equal based on an output signal of the NAND gate.

Figure 6:
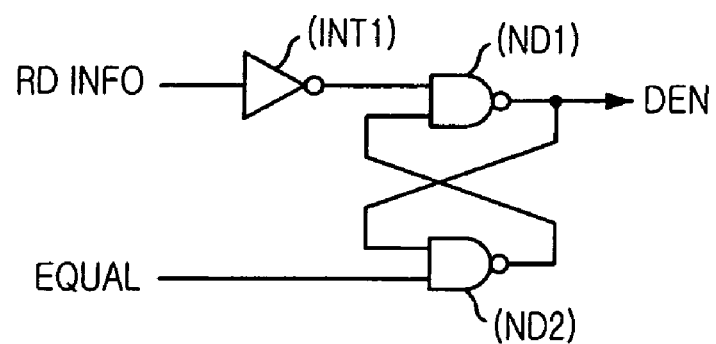
FIG. 6 is a detailed circuit diagram of the SR latch illustrated in FIG. 4.

FIG. 6 is a detailed circuit diagram of the SR latch 340 shown in FIG. 4. As shown therein, the SR latch 340 includes an inverter INT1 for receiving the signal RD info having information associated with the active mode, a first NAND gate ND1 for receiving an output of the inverter INT1 via one input terminal, and a second NAND gate nd2 for receiving the equal signal equal and an output of the first NAND gate ND1 to provide an output signal to the other input terminal of the first NAND gate ND1. This SR latch 340 functions to activate the control signal DEN if the signal RD info having the information associated with the active mode is activated and inactivates the control signal DEN if the equal signal equal is activated.

As described above, the DLL driver controller 300 of the present invention selectively outputs a clock by enabling the DLL driver 400 only when the clock is needed, by performing an operation on whether a clock is actually needed even in a normal mode and on how many clocks are needed if necessary. DLL driver controller 100 controls the clock buffer 200 for its off operation only in a range in which the clock is not used, e.g., the power-down mode or refresh mode. Thus, unnecessary current consumption is prevented.

Figure 7:
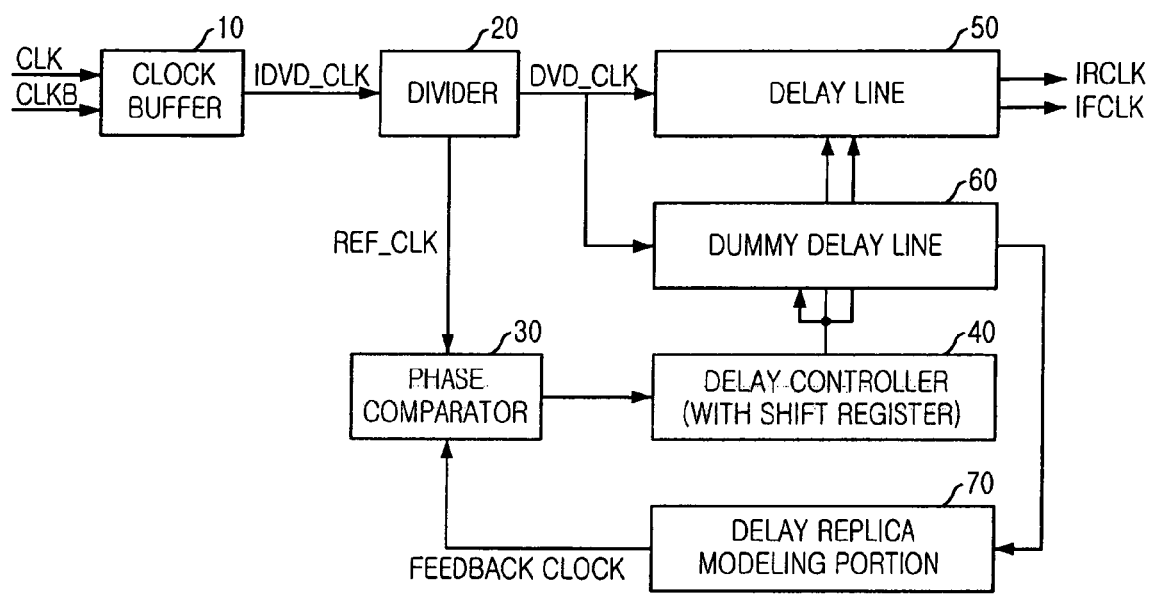
FIG. 7 is a detail block diagram of the DLL clock generator shown in FIG. 3.

FIG. 7 illustrates a detail block diagram of the DLL clock generator 500, for example, a register-controlled DLL. Referring to FIG. 7, the DLL clock generator 500 generally includes a clock buffer 10, a divider 20, a phase comparator 30, a delay controller 40, a delay line 50, a dummy delay line 60, and a delay replica modeling portion 70.

The clock buffer 10 receives and buffers external clocks clk and clkb, and generates an internal clock signal iDvd_clk.

The divider 20 divides the internal clock iDvd_clk to create a DLL source clock Dvd_clk and a reference clock ref_clk based on the internal clock iDvd_clk. Usually, the source clock is created by lowering a frequency of an external clock through the divider to reduce power consumption of the DLL circuit.

The phase comparator 30 is a device that compares an input clock of the DLL circuit with its output clock and detects a phase difference therebetween. Namely, a phase of the reference clock ref_clk from the divider 20 is compared with that of a feedback signal feedback clock that is fed back through the internal circuits of the DLL circuit to control the delay controller 40 depending on the comparison result.

The delay controller 40 comprises logic elements that determine an input path and a bidirectional shift register that changes direction of the path. The shift register receives four input signals and performs shifting operation. An initial input condition thereof could allow an initial maximum/minimum delay by holding both ends. Two signals are input for each of right shifting and left shifting, and the respective two signals have high level intervals so that they don't overlap each other for shifting operation.

The delay line 50 is a circuit for delaying a phase of an external clock. The degree of phase delay is determined by the phase comparator 30. A delay path that decides phase delay is determined under the control of the delay controller 40. The delay line comprises a plurality of unit delay cells in which NAND gates are coupled. Inputs to each of the unit delay cells are connected to respective corresponding shift registers. A path in which a value at an output stage of a shift register is at a high level is determined as a path for receiving a clock through the clock buffer. There exist delay lines for rising edge clocks and for falling edge clocks. This is to maximally prevent following distortion (duty ratio distortion) in any one direction by processing rising edge and falling edges equally.

The dummy delay line 60 is a delay line provided for the feedback signal applied to the phase comparator 30 and has the same construction as the delay line 50.

The delay replica model 70 beforehand models delay factors to the delay line 50 from receipt of the external clock until dispatching an output clock of the delay line 50 to the exterior of chip. The correct delay factors are used to determine a distorted value as the performance of the DLL circuit. The delay replica modeling portion 70 may use methods of shrinking, simplifying, and using basic circuits as is. It may be designed in advance that the delay replica modeling portion 70 models the clock buffer, the DLL driver, an R/F divider, and an output buffer as it is.

Figure 8:
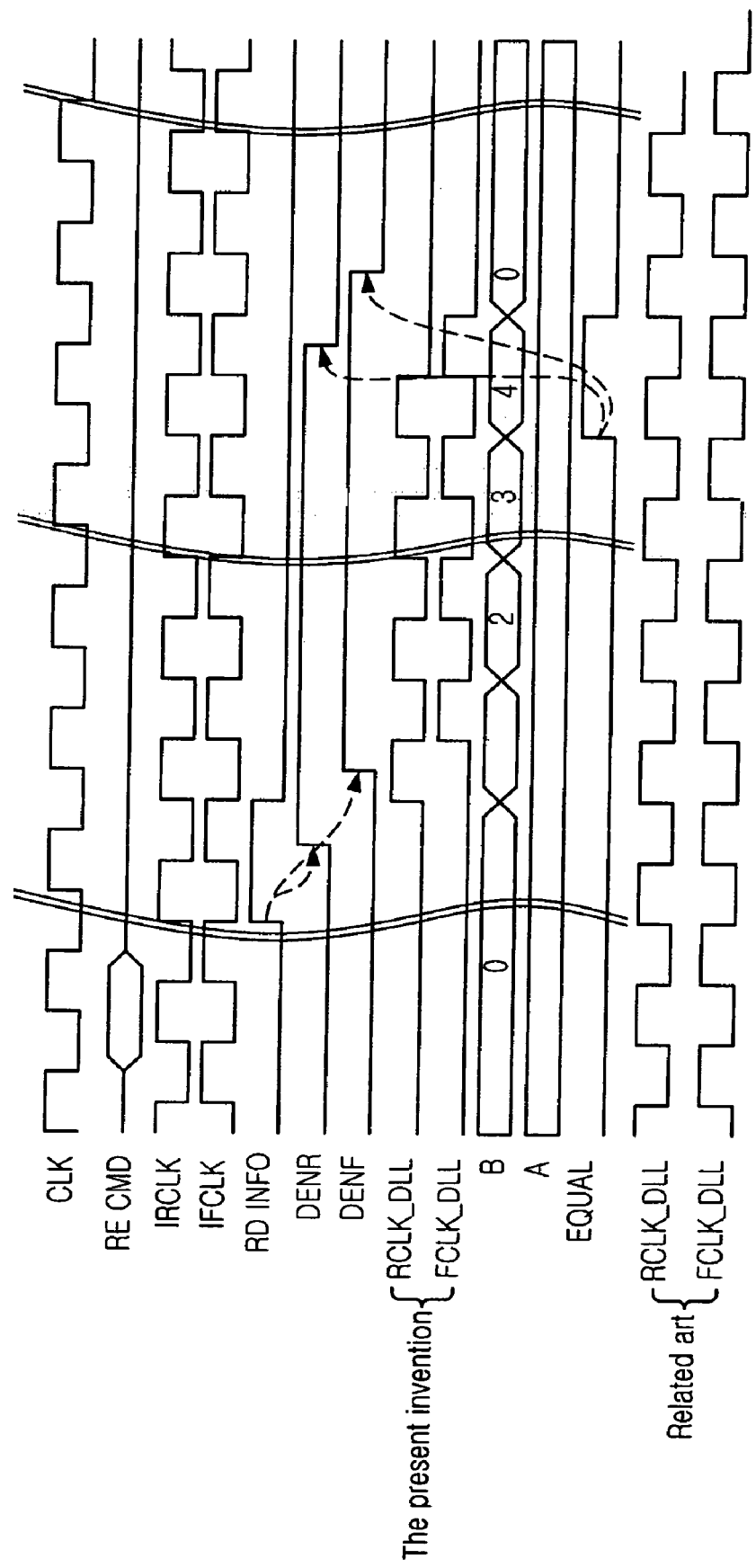
FIG. 8 is a timing diagram for describing a DLL driver control method in accordance with the present invention.

FIG. 8 is timing diagram for describing a DLL driver control method in accordance with the present invention. As shown therein, if an external signal RD info having information associated with an active mode, such as a read or write mode, is received, control signals DENr and DENf are activated. If a counted value B and a setting value A match each other, the control signals DENr and DENf are inactivated by an activated equal signal equal. The DLL driver 400 is driven only during an activation interval of the control signals DENr and DENf to toggle DLL clocks RCLK_DLL and FCLK_DLL. The rising DLL clock RCLK_DLL is toggled within the range of high pulse interval of the rising control signal DENr, while the falling DLL clock FCLK_DLL is toggled within the range of high pulse interval of the falling control signal DENf. This timing diagram may be partially varied based on the operation condition of DRAM, and the timing diagram shown herein is one of various examples.

In accordance with another embodiment of the present invention, if the DLL driver is not single but plural for diverse applications, it would also be possible to implement the DLL driver controller accordingly.

As set forth above, the present invention has an advantage in that it can considerably decrease current consumption by reducing current meaninglessly flowing by continuously controlling current being consumed due to increase of clock speed through the construction of the present invention.

The present application contains subject matter related to Korean patent application No. 2005-91650 & 2005-125353, filed in the Korean Patent Office on Sep. 29 & Dec. 19, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A Delay Locked Loop (DLL) driver control circuit comprising:
   a DLL driver for driving a DLL clock; and
   a DLL driver controller for generating a control signal to control an operation of the DLL driver in response to a signal having information associated with an active mode and a setting value having latency information,
   wherein the DLL driver controller includes:
   a counter for counting the DLL clock to produce a counted value having a plurality of bits
   a comparator for comparing the counted value with the setting value having a plurality of bits and generating an activated equal signal if the two values are the same; and
   an SR latch for accepting the equal signal and the signal having the information associated with the active mode to provide the control signal.

2. The DLL driver control circuit as recited in claim 1, wherein the DLL driver controller includes:
   an active command input means for receiving an active command.

3. The DLL driver control circuit as recited in claim 1, wherein the counter is reset when the control signal is input as a reset signal.

4. The DLL driver control circuit as recited in claim 1, wherein the comparator includes:
   a plurality of EX-NOR gates for accepting and EX-NOR-operating corresponding bits of the countered value and the setting value, respectively;
   a NAND gate for receiving and NAND-operating an output of each of the plurality of EX-NOR gates; and
   an inverter for receiving and inverting an output signal of the NAND gate to produce the equal signal.

5. The DLL driver control circuit as recited in claim 1, wherein the comparator activates the equal signal when the plurality of bits of the counted value are all identical to those of the setting value through the comparison of the values.

6. The DLL driver control circuit as recited in claim 1, wherein the SR latch activates the control signal when the signal having the information associated with the active mode is activated and inactivates the control signal when the equal signal is activated.

7. The DLL driver control circuit as recited in claim 1, wherein the SR latch includes:
   an inverter for receiving and inverting the signal having the information associated with the active mode;
   a first NAND gate for receiving an output of the inverter via one input terminal and an output of a second NAND gate via the other input terminal and NAND-operating the two outputs; and
   the second NAND gate for receiving and NAND-operating the equal signal and an output of the first NAND gate and providing an output signal to the other input terminal of the first NAND gate.

8. The DLL driver control circuit as recited in claim 1, wherein the signal having the information associated with the active mode corresponds to a read mode.

9. The DLL driver control circuit as recited in claim 1, wherein the signal having the information associated with the active mode corresponds to a write mode.

10. A DLL circuit, comprising:
    a DLL clock generator for generating a DLL clock;
    a DLL driver for driving the DLL clock; and
    a DLL driver controller for generating a control signal to control an operation of the DLL driver in response to a signal having information associated with an active mode and a setting value having latency information,
    wherein the DLL driver controller includes:
    a counter for counting the DLL clock to produce a counted value having a plurality of bits;
    a comparator for comparing the counted value with a-the setting value having a plurality of bits and generating an activated equal signal if the two values are the same; and
    an SR latch for accepting the equal signal and the signal having the information associated with the active mode to provide the control signal.

11. The DLL circuit as recited in claim 10, wherein the DLL driver controller includes:
    an active command input means for receiving an active command.

12. The DLL circuit as recited in claim 10, wherein the DLL clock generator includes:
    a clock buffer for buffering external clocks and outputting an internal clock;
    a divider for dividing the internal clock to generate a source clock and a reference clock;
    a delay line for receiving the source clock and delaying a phase of the internal clock to provide a delayed internal clock;
    a dummy delay line having the same construction as the delay line;
    a delay replica modeling unit for modeling an output signal of the dummy delay line in delay factors of a clock signal within a memory and providing a modeled signal as a feedback signal;
    a phase comparator for receiving the reference clock signal and the feedback signal and detecting a phase difference between the signals; and
    a delay controller for controlling phase delays of the delay line and the dummy delay line in response to an output signal from the phase comparator.

13. The DLL circuit as recited in claim 10 wherein the counter is reset when the control signal is input as a reset signal.

14. The DLL circuit as recited in claim 10 wherein the comparator includes:
    a plurality of EX-NOR gates for receiving and EX-NOR-operating corresponding bits of the countered value and the setting value, respectively;
    a NAND gate for receiving and NAND-operating an output of each of the plurality of EX-NOR gates; and
    an inverter for receiving and inverting an output signal of the NAND gate to produce the equal signal.

15. The DLL circuit as recited in claim 10, wherein the comparator activates the equal signal when the plurality of bits of the counted value are all identical to those of the setting value through the comparison of the values.

16. The DLL circuit as recited in claim 10 wherein the SR latch activates the control signal when the signal having the information associated with the active mode is activated and inactivates the control signal when the equal signal is activated.

17. The DLL circuit as recited in claim 10 wherein the SR latch includes:
- an inverter for receiving and inverting the signal having the information associated with the active mode;
- a first NAND gate for receiving an output of the inverter via one input terminal and an output of a second NAND gate via the other input terminal and NAND-operating the two outputs; and
- the second NAND gate for receiving and NAND-operating the equal signal and an output of the first NAND gate and providing an output signal to the other input terminal of the first NAND gate.

18. The DLL circuit as recited in claim 10, wherein the signal having the information associated with the active mode corresponds to a read mode.

19. The DLL circuit as recited in claim 10, wherein the signal having the information associated with the active mode corresponds to a write mode.

20. A Delay Locked Loop (DLL) driver control circuit comprising:
- a DLL driver for driving a DLL clock; and
- a counter for counting the DLL clock to produce a counted value having a plurality of bits;
- a comparator for comparing the counted value with a setting value having latency information and generating an activated equal signal if the two values are the same; and
- a DLL driver controller for generating a control signal to control an operation of the DLL driver, in response to a signal having information associated with an active mode and the equal signal;
- wherein the DLL driver controller includes an SR latch for accepting the equal signal and the signal having the information associated with the active mode to provide the control signal.

21. The DLL driver control circuit as recited in claim 20, wherein the counter is reset when the control signal is input as a reset signal.

22. The DLL driver control circuit as recited in claim 20, wherein the comparator activates the equal signal when the plurality of bits of the counted value are all identical to those of the setting value through the comparison of the values.

23. The DLL driver control circuit as recited in claim 20, wherein the SR latch activates the control signal when the signal having the information associated with the active mode is activated and inactivates the control signal when the equal signal is activated.

* * * * *